United States Patent
Lin et al.

(10) Patent No.: US 9,564,386 B2
(45) Date of Patent: Feb. 7, 2017

(54) SEMICONDUCTOR PACKAGE WITH STRUCTURES FOR COOLING FLUID RETENTION

(71) Applicant: International Business Machines Corporation, Armonk, NY (US)

(72) Inventors: Wei Lin, Albany, NY (US); Son V. Nguyen, Schenectady, NY (US); Spyridon Skordas, Albany, NY (US); Tuan A. Vo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/938,944

(22) Filed: Nov. 12, 2015

(65) Prior Publication Data

US 2016/0064307 A1      Mar. 3, 2016

Related U.S. Application Data

(63) Continuation of application No. 14/291,087, filed on May 30, 2014, now Pat. No. 9,263,366.

(51) Int. Cl.
*H01L 23/34* (2006.01)
*H01L 23/473* (2006.01)
(Continued)

(52) U.S. Cl.
CPC ........... *H01L 23/473* (2013.01); *H01L 21/481* (2013.01); *H01L 21/4803* (2013.01);
(Continued)

(58) Field of Classification Search
CPC ...... H01L 23/473; H01L 23/06; H01L 23/467; H01L 23/10; H01L 21/48; H01L 25/065; H01L 23/04; H01L 23/367
(Continued)

(56) References Cited

U.S. PATENT DOCUMENTS

| 4,894,709 A | * | 1/1990 | Phillips | F28F 3/12 257/714 |
| 5,002,123 A | * | 3/1991 | Nelson | F28F 3/02 165/147 |

(Continued)

OTHER PUBLICATIONS

Chang et al., "Materials for Micro and Nano Systems—Silicon Nanowire Fabrication by Metal-assisted Etching", Sponsorship: Singapore-MIT Alliance, Copyright © 2013 Materials for Micro and Nano Systems, <http://scripts.mit.edu/~cthomp/index.php?option=com_content&view=article&id=61&Itemid=115>.
(Continued)

*Primary Examiner* — Caleb Henry
(74) *Attorney, Agent, or Firm* — David B. Woycechowsky

(57) ABSTRACT

A semiconductor assembly for use with forced liquid and gas cooling. A relatively rigid nano-structure (for example, array of elongated nanowires) extends from an interior surface of a cap toward a top surface of a semiconductor chip, but, because of the rigidness and structural integrity of the nano-structure built into the cap, and of the cap itself, the nano-structure is reliably spaced apart from the top surface of the chip, which helps allow for appropriate cooling fluid flows. The cap piece and nano-structures built into the cap may be made of silicon or silicon compounds.

15 Claims, 10 Drawing Sheets

(51) Int. Cl.
*H01L 23/467* (2006.01)
*H01L 23/04* (2006.01)
*H01L 21/48* (2006.01)
*H01L 23/06* (2006.01)
*H01L 23/10* (2006.01)
*H01L 23/367* (2006.01)
*H01L 25/065* (2006.01)

(52) U.S. Cl.
CPC ...... *H01L 21/4817* (2013.01); *H01L 21/4871* (2013.01); *H01L 23/04* (2013.01); *H01L 23/06* (2013.01); *H01L 23/10* (2013.01); *H01L 23/3675* (2013.01); *H01L 23/467* (2013.01); *H01L 25/0655* (2013.01); *H01L 2924/0002* (2013.01)

(58) Field of Classification Search
USPC .......................................... 438/125; 257/704
See application file for complete search history.

(56) References Cited

U.S. PATENT DOCUMENTS

| | | | | |
|---|---|---|---|---|
| 6,101,715 | A * | 8/2000 | Fuesser | H01C 1/082 165/104.33 |
| 6,337,794 | B1 * | 1/2002 | Agonafer | H01L 23/473 174/259 |
| 6,400,012 | B1 * | 6/2002 | Miller | H01L 23/473 257/712 |
| 6,867,973 | B2 * | 3/2005 | Chang | F28F 13/12 165/109.1 |
| 6,934,154 | B2 * | 8/2005 | Prasher | F28D 15/0266 165/185 |
| 6,942,018 | B2 * | 9/2005 | Goodson | F04B 19/006 165/104.21 |
| 6,992,382 | B2 * | 1/2006 | Chrysler | H01L 23/473 257/706 |
| 7,115,987 | B2 * | 10/2006 | Holalkere | H01L 23/427 257/713 |
| 7,156,159 | B2 * | 1/2007 | Lovette | F28F 3/12 165/104.33 |
| 7,277,284 | B2 * | 10/2007 | Lee | H01L 23/3677 165/80.2 |
| 7,449,122 | B2 * | 11/2008 | Corbin | F04B 19/006 216/2 |
| 7,511,372 | B2 * | 3/2009 | Chiu | H01L 23/473 257/706 |
| 7,633,752 | B2 * | 12/2009 | Prasher | H01L 23/38 361/688 |
| 7,679,145 | B2 * | 3/2010 | He | H01L 21/823807 257/401 |
| 7,713,789 | B2 * | 5/2010 | Brunschwiler | H01L 21/4871 257/706 |
| 7,748,439 | B2 * | 7/2010 | Liu | G11B 5/3106 165/185 |
| 7,832,096 | B2 * | 11/2010 | Kuczynski | H01L 23/473 257/714 |
| 8,425,246 | B1 * | 4/2013 | Heng | H05K 7/1084 439/342 |
| 8,497,162 | B1 * | 7/2013 | Too | H01L 23/10 438/118 |
| 8,546,930 | B2 * | 10/2013 | Bakir | H01L 23/3677 257/686 |
| 8,860,210 | B2 * | 10/2014 | Kakiuchi | H01L 23/13 165/185 |
| 8,921,702 | B1 * | 12/2014 | Carter | H05K 1/0204 165/104.11 |
| 8,937,810 | B2 * | 1/2015 | Brunschwiler | H05K 7/20772 165/104.33 |
| 9,052,724 | B2 * | 6/2015 | Bernstein | H01L 23/38 |
| 2004/0151598 | A1 * | 8/2004 | Young | F04B 17/00 417/208 |
| 2004/0190252 | A1 * | 9/2004 | Prasher | F28D 15/0266 361/699 |
| 2005/0139996 | A1 * | 6/2005 | Myers | H01L 23/473 257/712 |
| 2005/0280128 | A1 * | 12/2005 | Mok | H01L 23/427 257/678 |
| 2005/0280162 | A1 * | 12/2005 | Mok | H01L 23/427 257/778 |
| 2006/0289987 | A1 * | 12/2006 | Chiu | H01L 23/473 257/714 |
| 2007/0029665 | A1 * | 2/2007 | Lee | H01L 23/473 257/712 |
| 2007/0258213 | A1 * | 11/2007 | Chen | F28D 15/0233 361/701 |
| 2008/0043440 | A1 | 2/2008 | Fedorov | |
| 2008/0108122 | A1 * | 5/2008 | Paul | B01F 5/0475 435/183 |
| 2008/0190119 | A1 * | 8/2008 | Smayling | G06F 1/20 62/56 |
| 2008/0245847 | A1 * | 10/2008 | Budd | B23K 3/0607 228/253 |
| 2008/0277779 | A1 * | 11/2008 | Gupta | H01L 23/473 257/714 |
| 2009/0057881 | A1 * | 3/2009 | Arana | H01L 23/473 257/714 |
| 2010/0200197 | A1 * | 8/2010 | Bezama | H01L 23/3733 165/84 |
| 2010/0263838 | A1 * | 10/2010 | Mahalingam | F25D 17/02 165/104.31 |
| 2012/0298037 | A1 * | 11/2012 | Paul | B01F 5/0475 118/712 |
| 2015/0021755 | A1 * | 1/2015 | Hsiao | H01L 25/0657 257/714 |
| 2015/0194363 | A1 * | 7/2015 | Jun | H01L 23/367 257/714 |

OTHER PUBLICATIONS

Narayanan, Shankar, "Gas-Assisted Thin-Film Evaporation from Confined Spaces", A Dissertation Presented to the Academic Faculty, Georgia Institute of Technology, Dec. 2011, Approved, Aug. 25, 2011, pp. 1-182.

Narayanan et al., "Gas-Assisted Thin-Film Evaporation from Confined Spaces for Dissipation of High Heat Fluxes", Nanoscale and Microscale Thermophysical Engineering, vol. 13, Issue 1, pp. 30-53, 2009, Copyright © Taylor & Francis Group, LLC, ISSN: 1556-7265 print / 1556-7273 online, DOI:10.1080/15567260802625908, <http://www.tandfonline.com/doi/full/10.1080/15567260802625908>.

Seo et al., "Direct Gravure Printing of Silicon Nanowires Using Entropic Attraction Forces", Article first published online: Mar. 19, 2012, DOI: 10.1002/smll.201102367, Copyright © 2012 Wiley-VCH Verlag GmbH & Co. KGaA, Weinheim, <http://onlinelibrary.wiley.com/doi/10.1002/smll.201102367/abstract;jsessionid=8122A612798A7B1DE207F9020FDE8EFD.d04t01?deniedAccessCustomisedMessage=&userIsAuthenticated=false>.

Lin et al., "Semiconductor Chips With Small Scale Structures for Liquid Cooling", U.S. Appl. No. 14/291,087, filed May 30, 2014.

Appendix P—List of IBM Patents or Patent Applications Treated as Related, Filed Nov. 12, 2015, 2 pages.

* cited by examiner

SEMICONDUCTOR PACKAGE WITH STRUCTURES FOR COOLING FLUID RETENTION

BACKGROUND OF THE INVENTION

The present invention relates generally to the fields of liquid cooling of semiconductor chip circuitry, including phenomena such as gas-assisted evaporation of the cooling fluid, wetting of the chip surface(s) to be cooled and liquid retention by capillary force.

Gas-assisted direct liquid cooling (GADLC) integrated circuit devices (ICs) are known. GADLC ICs are shaped to define interior space having interior surfaces. At least one of the interior surfaces (herein referred to as the liquid/chip interface) at, or at least close to, the IC circuitry that, in operation, generates heat such that cooling is required, or at least helpful. The interior space may have, located within it, porous material, such as a porous membrane. Gas and coolant fluid are circulated through the interior space in order to remove heat from the vicinity of the heat-generating circuitry of the IC.

It is conventionally recognized that conventional GADLC ICs may experience "dry spots" at the liquid/chip interface. These dry spots hamper the cooling efficiency and reliability of the technology. In order to attempt to reduce dry spots, conventional GADLC IC include a membrane (as mentioned in the previous paragraph) and a support layer. The membrane and support layer are located in the interior space. This membrane and support layer are separate parts that are not integral or unitary with the material that forms the interior surfaces of the interior space. The membrane is conventionally a micro-/nano-porous membrane to maintain the coolant in the pores, and a porous support layer at the interface to keep the nano-membrane from coming in to direct contact with the chip.

SUMMARY

According to an aspect of the present invention, a semiconductor assembly includes: (i) a substrate member including a first chip and a top surface; and (ii) a cap member with a first recess located therein, the cap member including a first recess surface and a first set of rigid small scale structure(s) extending from at least a portion of the first recess surface into the first recess, with the first recess surface and the first set of rigid small scale structures defining the first recess. The first set of rigid small scale structure(s) include at least one of the following: (a) a structure having formed therein pores, gaps and or interstitial spaces less than 100 micrometers but more than 100 nanometers, and (b) a structure having formed therein pores, gaps and or interstitial spaces less than 100 nanometers. The first set of rigid small scale structure(s) are sized, shaped and located to provide for appropriate fluid flow when gas and liquid are circulated through the first recess for gas-assisted direct liquid cooling. The cap member is attached to the top surface of the substrate member at a location such that circulation of gas and liquid through the first recess will cool the first chip by gas-assisted direct liquid cooling.

According to a further aspect of the present invention, a method of manufacturing a semiconductor assembly includes the following steps (not necessarily in the following order): (i) shaping a cap member to include a first set of small-scale-structure(s) and a first recess surface, with the first recess surface and first set of rigid small scale structure(s) defining a recess formed in the cap member; and (ii) bonding the cap member to a top surface of a first substrate which includes a first chip so that the first recess is located over at least a portion of the top surface and at least a portion of the first chip. The first set of small-scale-structure(s) are rigid. The cap member and first set of small-scale-structure(s) are sized, shaped, located and/or bonded so that: (i) the first set of small-scale-structure(s) face at least a portion of the top surface of the first chip, (ii) the first set of small-scale-structure(s) spaced away from the top surface of the first chip, and (iii) the first set of small scale structure(s) includes at least one of the following: (a) a structure having formed therein pores, gaps and or interstitial spaces less than 100 micrometers but more than 100 nanometers, and (b) a structure having formed therein pores, gaps and or interstitial spaces less than 100 nanometers.

According to a further aspect of the present invention, a semiconductor assembly includes: (i) a substrate member including a plurality of chips and a top surface; and (ii) a cap member with a plurality of recesses formed therein, the cap member including a recess surface corresponding to each recess of the plurality of recesses and a plurality of sets of rigid small scale structure(s) respectively extending from at least a portion of each recess surface into each recess, with each recess surface and each set of rigid small scale structure(s) respectively defining a corresponding recess of the plurality of recesses. Each set of rigid small scale structure(s) includes a structure having formed therein pores, gaps and or interstitial spaces equal to or less than 100 micrometers. Each set of rigid small scale structure(s) are sized, shaped and located to provide for appropriate fluid flow when gas and liquid are circulated through the first recess for gas-assisted direct liquid cooling. The cap member is attached to the top surface of the substrate member at a location such that circulation of gas and liquid through each recess cools a corresponding chip of the plurality of chips by gas-assisted direct liquid cooling.

BRIEF DESCRIPTION OF THE SEVERAL VIEWS OF THE DRAWINGS

FIGS. 1 to 7A are cross-sectional views of a semiconductor assembly corresponding respectively to seven stages of a first semiconductor fabrication method;

DETAILED DESCRIPTION

A preliminary note on terminology will now be made. In this document, empty spaces, such as voids, apertures holes and/or recesses are said to be "defined" by the surfaces that surround the empty space. For example, the empty space inside of a cup is defined by the inner surface(s) of the cup itself.

Some embodiments of the present disclosure recognize one, or more, of the following: (i) because of the membrane structure required for conventional GADLC chips conventional processes are not easily and/or feasibly scalable; and/or (ii) with conventional GADLC processing, precise control (such as, placement of the membrane and its support, the force, the gap between the membrane and the chip surface, MNS structure control) is difficult.

Some embodiments of the present invention are directed to fabrication methods for making "built-in" MNSs for GADLC, such that there is no separate membrane piece, but, rather, the MNS is part of a unitary and integral cap piece that is fixed over a top surface of the semiconductor chip. Gas and/or liquid is circulated through an open space between the cap and a portion of the top surface of the semiconductor chip. The MNSs are located to extend from the main body of the cap, down into the open space between the cap and chip, where they can appropriately assist with fluid circulation (for example, GADLC fluid circulation) for chip cooling. Two basic variations of the various embodiments of the present invention are as follows: (i) providing the cap structure on a chip by chip basis; and (ii) providing the cap structure on a wafer by wafer basis. Some embodiments of the present invention are believed to be more amenable to wafer by wafer fabrication than is the conventional nano-membrane technology. Accordingly, while the embodiments to be described below will show only a single chip, some embodiments of the preferred invention will provide a single cap piece with multiple, discrete fluid spaces for multiple chip areas that reside on a single wafer.

Figure 1:
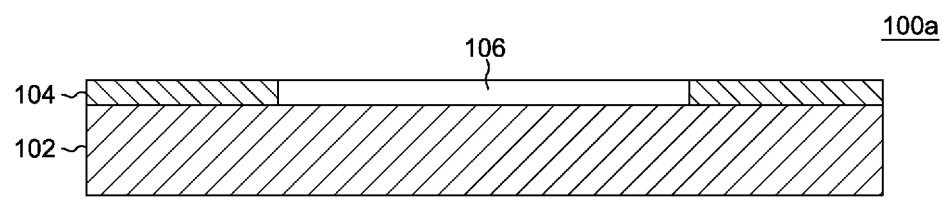
Figure 5:
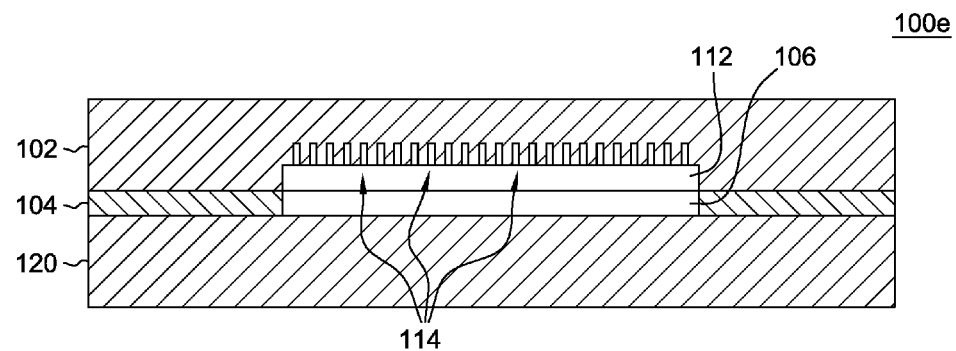
Figure 6:
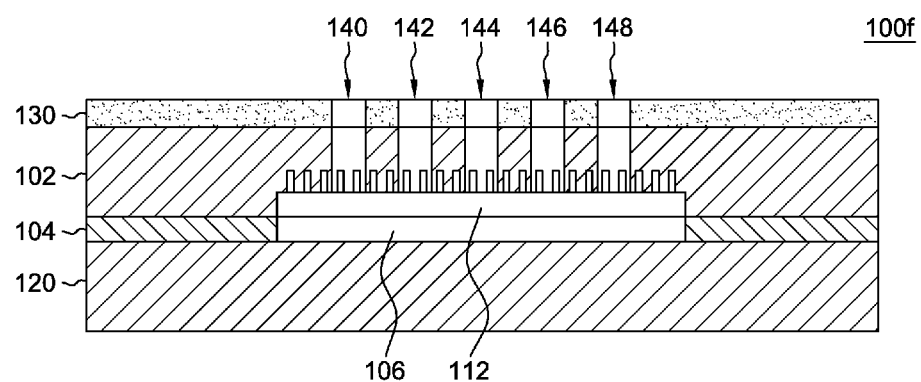
Figure 7A:
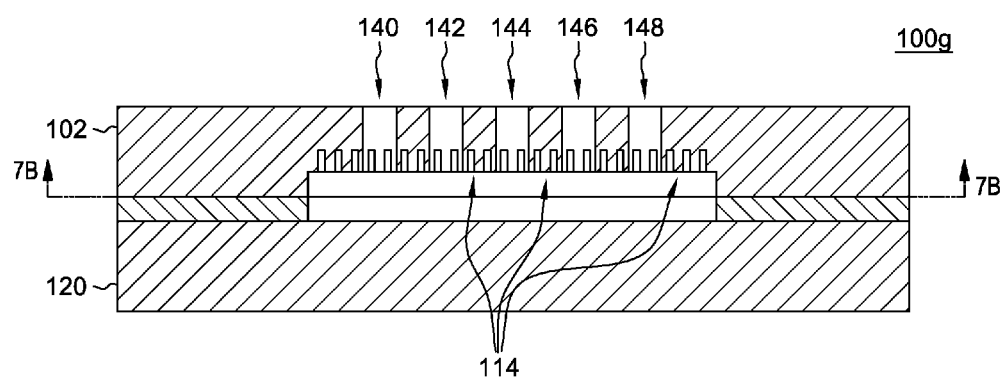
Figure 7B:
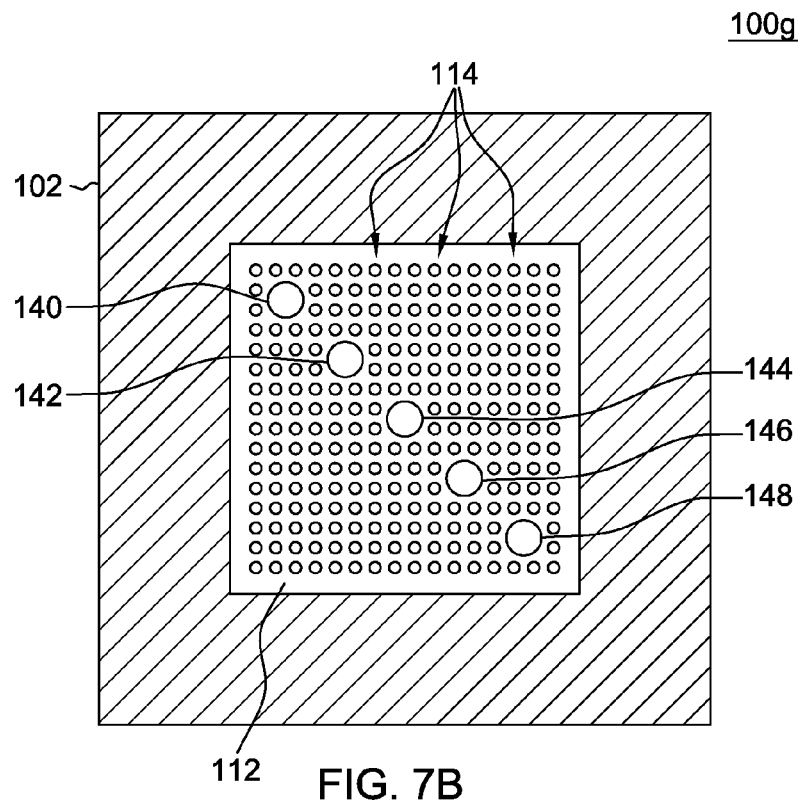
FIG. 7B is a plan view of the seventh stage of the first embodiment fabrication method.

As shown in FIGS. 1 to 7b, a first fabrication method includes six (6) intermediate assemblies 100a, 100b, 100c, 100d, 100e and 100f and one final assembly 100g (which is also shown in plan view in FIG. 7b). For pedagogical purposes, it is noted that the respective assemblies 100a to 100g do not represent an exhaustive list of assembly states during manufacture, but, rather, these assemblies were chosen to efficiently assist those of skill in the art to understand the devices and/or manufacturing processes of the present invention. The following paragraphs will describe the processes involved in transforming the starting assembly 100a to intermediate assembly 100b, intermediate assembly 100b to intermediate assembly 100c, intermediate assembly 100c to intermediate assembly 100d, and so on until the final assembly of 100g is attained for use as an embodiment of a GADLC IC device. As shown in FIG. 1, in intermediate sub-assembly 100a, a chip sized area (shown) of a larger piece (not shown) of silicon cap material 102 (for example, silicon) is partially overlaid with a bonding layer 104. More specifically, the bonding layer is shaped to have a square hole 106 at its central region.

Figure 2:
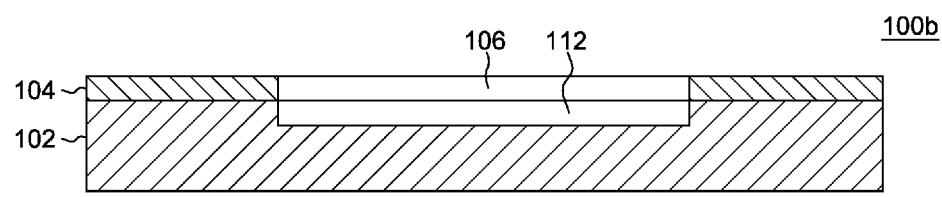

As manufacturing processes according to this embodiment of the present invention transform intermediate assembly 100a of FIG. 1 to intermediate assembly 100b of FIG. 2, the portion of the top surface of cap 102 exposed by hole 106 of boding layer 104 has material removed in a top down fashion in order to form recess 112. The recess may be formed, for example by conventional wet etching or conventional dry etching.

Figure 3:
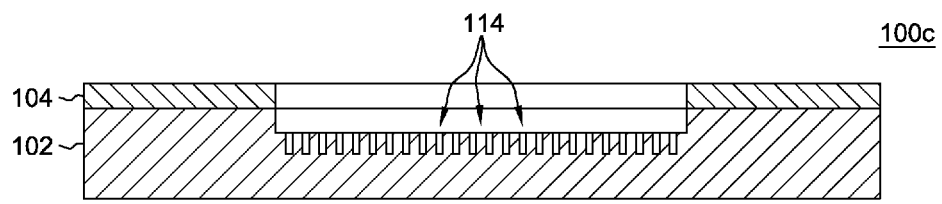
Figure 8A:
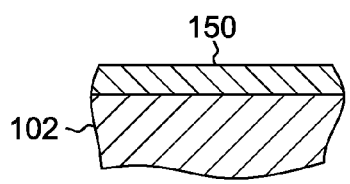
FIGS. 8A, 8B, 8C and 8D are cross-sectional, detail views of a nanowire formation process suitable for use in some embodiments of the present invention.
Figure 8C:
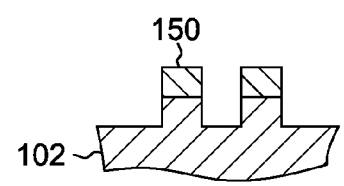
Figure 8B:
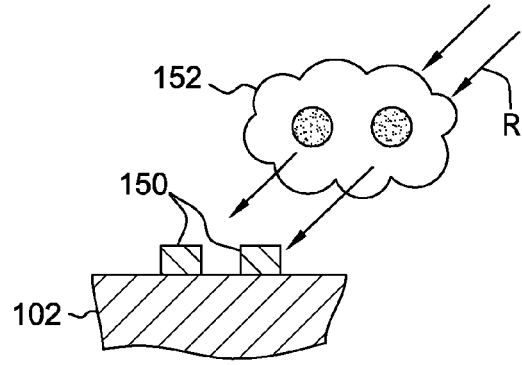
Figure 8D:
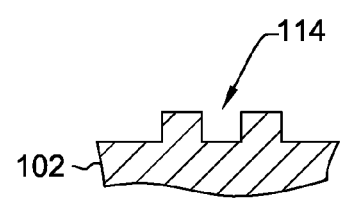

As manufacturing processes according to this embodiment of the present invention transform intermediate assembly 100b of FIG. 2 to intermediate assembly 100c of FIG. 3, MNSs 114 are formed at the bottom of the recess in cap 102 as shown in FIG. 3. This process for forming MNSs is shown in more detail in FIGS. 8A to 8D, where: (i) in FIG. 8A, a photoresist layer 150 is applied over semiconductor cap 102; (ii) in FIG. 8B, radiation R is selectively transmitted by mask 152 so that the photoresist layer can be selectively removed, at a nano- or micro-scale; (iii) In FIG. 8C, the semiconductor cap is etched in a top down material removal fashion, except in portions underlying remaining portions of the photoresist layer; and (iv) in FIG. 8D, where the remaining portions of the photoresist layer are removed to expose the MNS protrusions left by the selective etching. Alternatively, a bottom up process can be used to build MNSs, where certain areas of the upper surface of the silicon cap are seeded with polymer and/or seed crystals so that silicon MNS protrusions can be selectively built up from the seeded areas only. For example, conventional chemical vapor deposition can be used to build up the silicon in the seeded areas to build bottom up MNS protrusions. It is noted that the MNSs are built into a rigid cap here, rather than being present in a conventional membrane structure.

Figure 4:
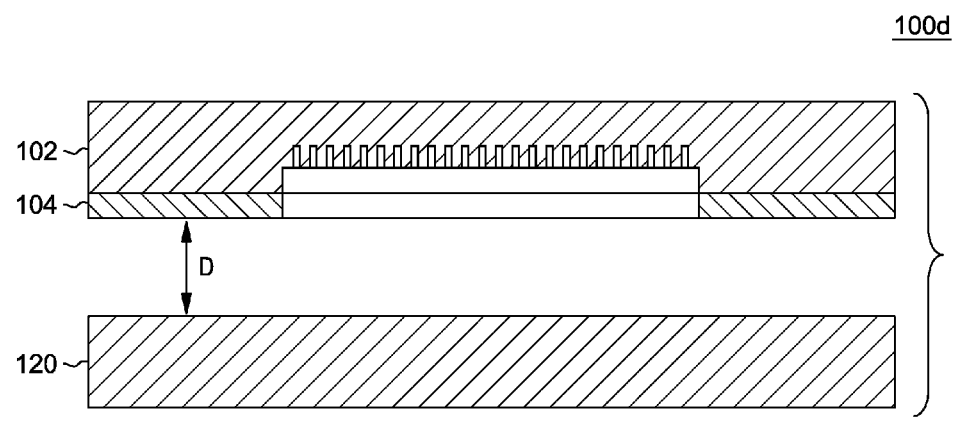

As manufacturing processes according to this embodiment of the present invention transform intermediate assembly 100c of FIG. 3 to intermediate assembly 100d of FIG. 4, the cap is rotated (or, in semiconductor device fabrication parlance, "flipped") and placed over semiconductor substrate 120. Again, while FIGS. 1 to 7a and 7b show only an area corresponding to a single chip, some devices according to the present invention are fabricated at the wafer scale so that both the cap portion and the semiconductor substrate portion are wafer sized and include many chips, which will usually be cut apart to form multiple discrete chips or chip stacks. In order to proceed from intermediate assembly 100d of FIG. 4 to intermediate assembly 100e of FIG. 5, the cap and substrate are moved relative to each other in the vertical direction so that bonding layer 104 bonds the cap and substrate to each other, aligned so that recess 106, 112 is located over the central region of the semiconductor substrate. The bonding layer can be oxide, metal-metal, adhesive, etc. In some embodiments, the bonding is asymmetric bonding, but symmetric bonding can also be applied, meaning a same bonding layer (with/without the same opening/recess) can also be pre-formed on the surface of substrate 120.

As manufacturing processes according to this embodiment of the present invention transform intermediate assembly 100e of FIG. 5 to intermediate assembly 100f of FIG. 6: (i) lithographic masking layer 130 with 5 through holes is applied over the top surface of cap 102; and (ii) cap material 102, underlying the through holes in the masking, is removed to form five (5) channels 140, 142, 144, 146, and 148. In some embodiments, the material removal performed to remove the channels is performed by reactive ion etching ("silicon RIE") as will be understood by those of skill in the art. It is noted that there is some concern that this material removal process could cause pieces of silicon to end up in open volume 106, 112, and impede performance of the complete product when the chip is put into use and has gas and liquid running through it. In embodiments where this is a valid concern, the alternative fabrication methods, to be described below, will prevent this problem.

As manufacturing processes according to this embodiment of the present invention transform intermediate assembly 100f of FIG. 6 to final chip assembly 100g of FIGS. 7a and 7b the lithographic masking layer is removed to yield the finished product. In wafer level fabrication processes, this is where the cutting of the wafer down to individual, capped chip assemblies can be done. The locations of the five (5) channels 140, 142, 144, 146 and 148 can be best understood by looking at both FIGS. 7a and 7b in tandem. In this embodiment, when the chip assembly is operatively connected to a larger GADLC system: (i) channel 140 acts as an inlet for liquid coolant into the interior space; (ii) channels 142 and 146 act as gas outlets for the GADLC gas; (iii) channel 144 acts as a gas inlet for the GADLC gas; and (iv) channel 148 acts as a fluid inlet/outlet for the GADLC fluid. Alternatively, other channel geometries are possible.

Before moving to other, alternative fabrication processes according to the present invention, some possible variations on device 100 of FIGS. 1 to 7a and 7b will now be set forth: (i) the footprint shape of the interior space does not need to be square (for example, it could be rectangular or circular); and/or (ii) the number of through holes formed at intermediate assembly 100f of FIG. 6 may be different than 5 (the number is a matter of design choice that depends, at least in part, on the gas flow and/or liquid flow requirements of a given GADLC IC design). The foregoing is by no means an exhaustive list of possible variations of the embodiment of device 100.

Before moving to other, alternative fabrication processes according to the present invention, it is noted that some embodiments of the present invention may include one, or more, of the following features, characteristics and/or advantages: (i) the built-in micro-/nano-structures do not require externally introduced membranes/support materials; (ii) during fabrication, piece parts are easier to handle and can be precisely controlled, fabricated and/or assembled by tailoring the MNSs, recession process, and bonding process; (iii) cooling structures can be fabricated in large scale semiconductor fabrication and packaging line with current process equipment and advanced printing; (iv) profiling of the cap at the micro and/or nano scale enables complex cooling structures and channels for optimal specific local cooling; (v) the MNSs are spaced apart from the major surface of the chip which they face; (vi) a built-in structure for gas-assisted direct liquid cooling in advanced thermal management; (vii) a method of fabricating the structure for gas-assisted direct liquid cooling, the method being scalable to wafer-level 3D integration and packaging; (viii) MNSs (such as MNS 114) in the form of a regular array of nanowires; (ix) nano-openings in the nano-structure layer that are interconnected in the x-y plane, and therefore, as a whole, only need one gas inlet and one gas outlet for the circulation purposes; (x) have a nanowire (and/or pore) layer (for example MNS 114) that acts similar to the membrane layer of a conventional GADLC chip, with the functions of (a) maintaining the liquid to prevent formation of dry spots, and (b) circulation in/out through gas in/out channels to improve the cooling efficiency (compared with only liquid coolant cooling); and (xi) the MNS structure may be, or include well and/or via, such as nanowells or nanovias (nanowire arrays are interconnected in the X-Y direction, but a nanowell/via array is isolated in X-Y direction so that, during cooling, the gas and/or liquid are contained in the well/via by capillary force and pressure control). Some embodiments of the present invention may include one, or more, of the following features, characteristics and/or advantages: (i) a bonding layer and a recess region constructed as a "built in" structure in a rigid cap piece that maintains an accurate separation gap between the MNSs and the upper surface of the semiconductor chip; and/or (ii) easy to control (or "tune") the size of the gap, between the MNS layer and the upper surface of the semiconductor chip, in the range of a few microns to tens of microns.

Figure 9A:
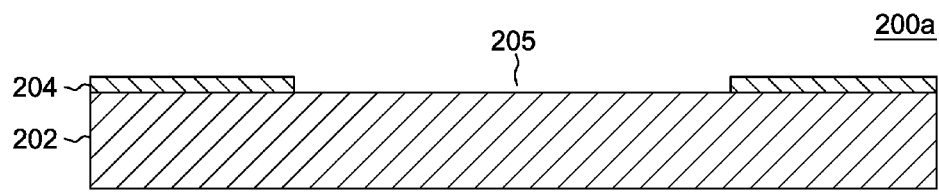
FIGS. 9A, 9B, 9C, 9D, 9E, 9F, 9G and 9H are cross-sectional views of a semiconductor assembly corresponding respectively to eight stages of a second semiconductor fabrication method.
Figure 9B:
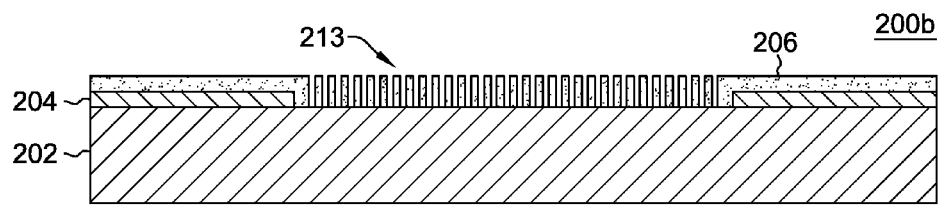
Figure 9C:
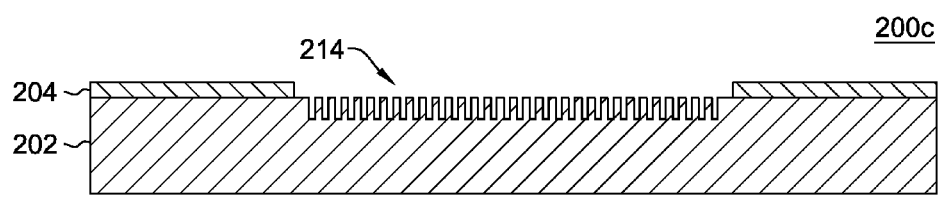
Figure 9D:
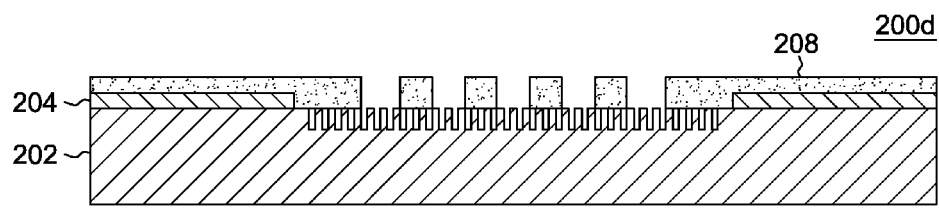
Figure 9E:
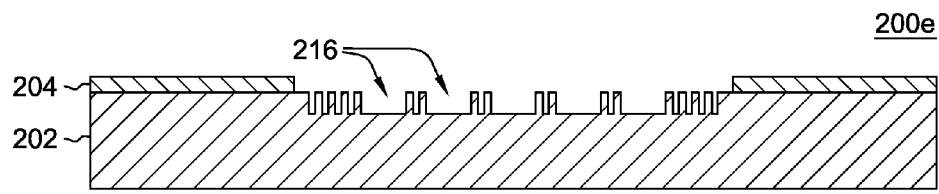
Figure 9F:
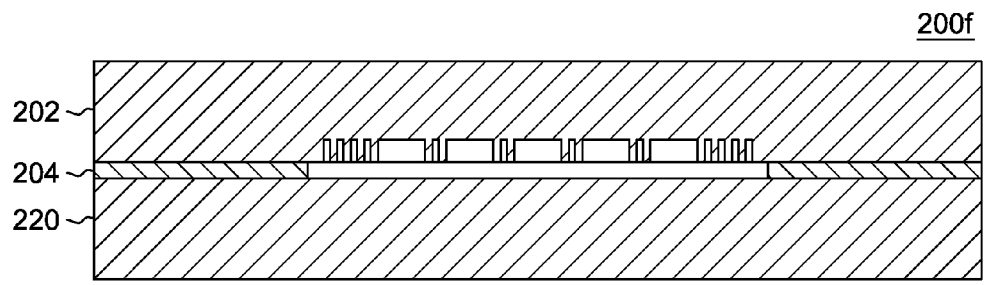
Figure 9G:
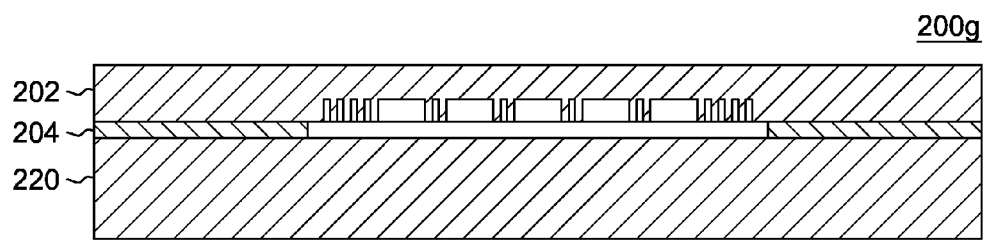
Figure 9H:
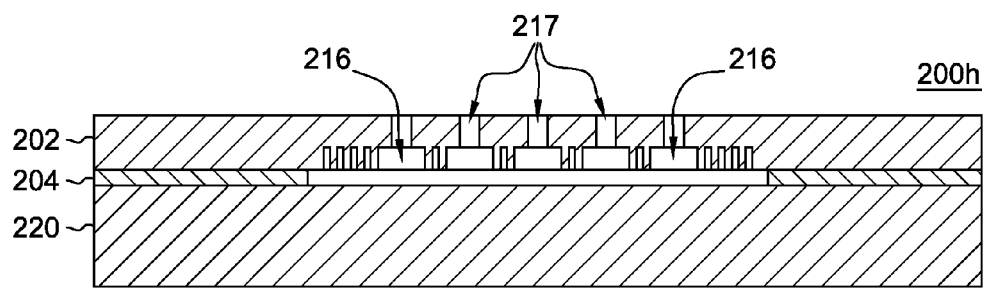

FIGS. 9A to 9H respectively show seven (7) intermediate assemblies (assemblies 200a, 200b, 200c, 200d, 200e, 200f, 200g of, respectively FIGS. 9A to 9G) and one (1) final assembly (assembly 200h of FIG. 9H). These assemblies show a second example of a fabrication process according to the present disclosure called the "channel last," MNSs first method. For pedagogical purposes, it is noted that the respective assemblies 200a to 200g do not necessarily represent an exhaustive list of assembly states during manufacture, but, rather, these assemblies were chosen to efficiently assist those of skill in the art to understand the devices and/or manufacturing processes of the present invention. The following paragraphs will describe the processes involved in transforming the starting assembly 200a to intermediate assembly 200b, intermediate assembly 200b to intermediate assembly 200c, intermediate assembly 200c to intermediate assembly 200d, and so on until the final assembly of 200g is attained for use as an embodiment of a GADLC IC device.

As shown in FIGS. 9A to 9H, the assemblies 200a to 200h collectively include: silicon cap layer (or, simply, "cap") 202; bonding layer 204; rectangular hole 205; first photoresist layer 206; second photoresist layer 208; MNS masking region 213; MNS region (or nanowires/nanowells) 214; recesses 216; and channels 217.

As shown in FIG. 9A, first intermediate assembly 200a is provided with bonding layer 204 overlaid on cap 202. As in the previous fabrication embodiment, the bonding layer has a rectangular hole 205.

As manufacturing processes according to this embodiment of the present invention transform first intermediate assembly 200a (see FIG. 9A) to second intermediate assembly 200b (FIG. 9B): (i) photoresist layer 206 is overlaid over cap 202 and bonding layer 204 (for example, by spin coating); and (ii) photoresist layer 206 is patterned (for example, by litho-patterning) to include MNS masking region 213. In order to proceed from second intermediate assembly 200b (see FIG. 9B) to third intermediate assembly 200c (FIG. 9C): (i) RIE is used to remove material from the non-masked portions in the central region of cap 202 in order to form MNS region (for example, nanowires) 214 of cap 202; and (ii) photoresist layer 206 is stripped away. Shape, diameter, and/or depth of the MNSs of MNS region 214 can be customized easily. Typically, characteristic length in the radial direction is tens of nanometers to a few microns. Depth lies between a couple of hundred nanometers to tens of microns. Cross-sectional shape of the MNSs can be annular, rectangular, etc.

As manufacturing processes according to this embodiment of the present invention transform third intermediate assembly 200c (see FIG. 9C) to fourth intermediate assembly 200d (FIG. 9D): (i) a second photoresist layer 208 is laid on top of assembly 200c; and (ii) photoresist layer 208 is patterned to have five (5) circular holes (in various embodiments, this number of holes and resultant channels may be greater or smaller).

As manufacturing processes according to this embodiment of the present invention transform fourth intermediate assembly 200d (see FIG. 9D) to fifth intermediate assembly 200e (FIG. 9E): (i) RIE is used to remove material from the non-masked portion MNS region 214 of cap 202 in order to remove the nanowires (or other MNS structures) of MNS region 214 in the shape of five (5) cylindrical recesses (also called "open areas") 216; and (ii) second photoresist layer 208 is stripped away. Diameter(s) of the open areas in this example are on the order of tens of microns to several millimeters.

As manufacturing processes according to this embodiment of the present invention transform fifth intermediate assembly 200e (see FIG. 9E) to sixth intermediate assembly 200f (FIG. 9F): (i) cap sub-assembly 202, 204 is flipped into position in horizontal plane alignment with chip 220; and (ii) the cap sub-assembly and the chip are moved into mutual contact so that bonding layer 204 bonds the cap sub-assembly to the chip to form intermediate assembly 200f. It is noted that a bonding layer can also be applied on the surface of the 220 substrate, with/without an opening/recess corresponding to 205 in the cap. As with the previous example fabrication process, discussed above, the second example fabrication process, now under discussion, can be performed at the wafer (with multiple chips) level, rather than at the single chip level, for example in a three dimensional integration (3Di) or packaging scenario.

As manufacturing processes according to this embodiment of the present invention transform sixth intermediate assembly 200f (see FIG. 9F) to seventh intermediate assembly 200g (FIG. 9G) silicon cap layer 202 is subject to material removal to reduce its thickness. Wafer thinning can be done by grinding, wet etch, RIE, or a combination of the foregoing. The final thickness of the top wafer is on the order of tens of microns to a couple of hundreds of microns. Caps, according to various embodiments of the present invention, can be full thickness or intentionally thinned. The thinning process can be done by grinding, wet etching, or dry etching, or combined, and can be carried out before or after the bonding process. Also, a pre-thinned cap can be used, meaning the cap can also be thinned first and then patterned through the processes of intermediate assemblies 200a-200e.

As manufacturing processes according to this embodiment of the present invention transform seventh intermediate assembly 200g (see FIG. 9G) to final assembly 200h (FIG. 9H) five (5) channels 217 are opened by removing material from silicon cap layer 202. As shown in FIG. 9H, these five (5) channels are respectively aligned with the five (5) cylindrical recesses 216 so that GADLC gases and/or liquids can be communicated between the interior space of assembly 200h and the outside. In this example, open areas 216 have somewhat larger diameters than their respective channels 217. This final interfacial structure between the two wafers and its enabled cooling function are different than conventional GADLC cooled chip structures. The surface of the device chip is usually capped (e.g., with NBLOK (that is dielectric cap material with a general formula of SiNx-CyHz)). The silicon RIE process is selective to the capping material.

Figure 10A:
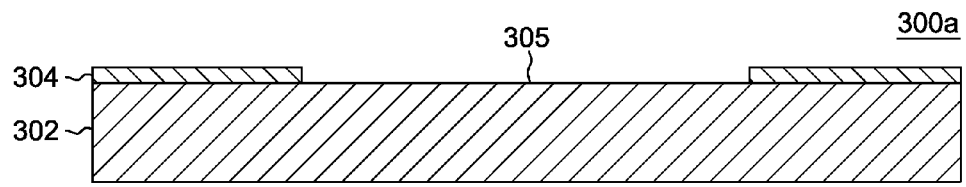
FIGS. 10A, 10B, 10C, 10D and 10E are cross-sectional views of a semiconductor assembly corresponding respectively to five stages of a third semiconductor fabrication method.
Figure 10B:
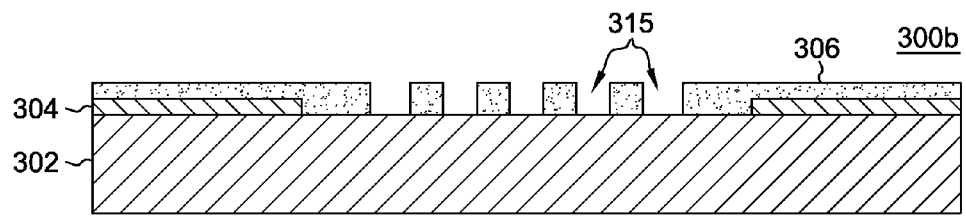
Figure 10C:
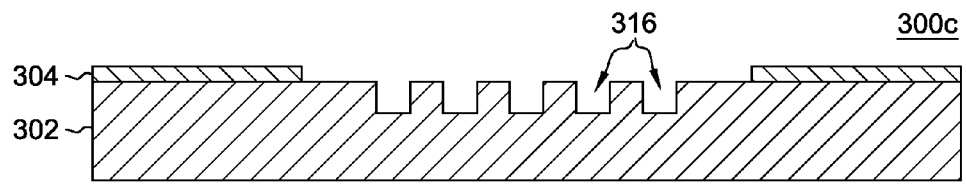
Figure 10D:
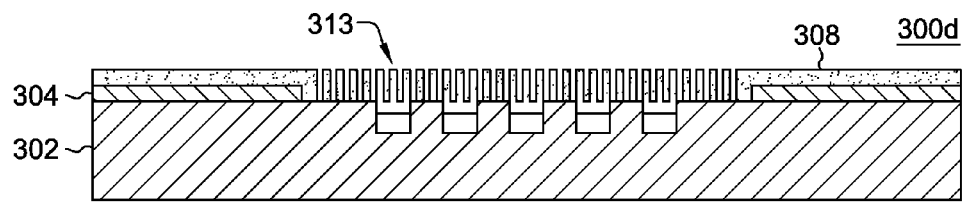
Figure 10E:
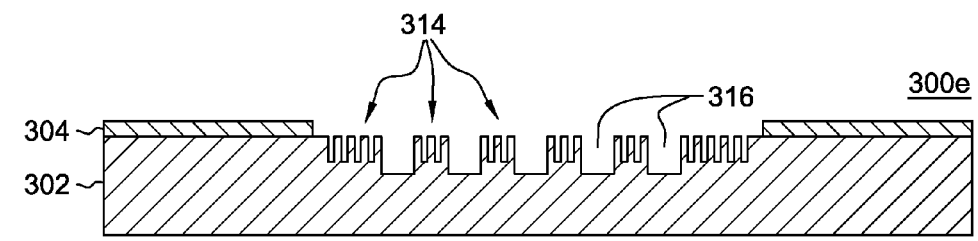

FIGS. 10A to 10E respectively show four (4) intermediate assemblies (assemblies 300a, 300b, 300c, 300d respectively FIGS. 10A to 10D) and one (1) sub-assembly (assembly 300e of FIG. 10E). These assemblies show a third example of a fabrication process according to the present disclosure called the "channel last open areas first method."). For pedagogical purposes, it is noted that the respective assemblies 300a to 300d do not represent an exhaustive list of assembly states during manufacture, but, rather, these assemblies were chosen to efficiently assist those of skill in the art to understand the devices and/or manufacturing processes of the present invention. The following paragraphs will describe the processes involved in transforming the starting assembly 300a to intermediate assembly 300b, intermediate assembly 300b to intermediate assembly 300c, and so on until the final assembly of 300e is attained for use as an embodiment of a GADLC IC device.

As shown in FIGS. 10A to 10E, assemblies 300a to 300e collectively include: silicon cap layer (or, simply, "cap") 302; bonding layer 304; rectangular hole 305; first photoresist layer 306; second photoresist layer 308; MNS masking region 313; MNS region (or nanowires) 314; masking open areas 315; and recesses 316.

As shown in FIG. 10A, first intermediate assembly 300a is provided with the bonding layer overlaid on cap 302. As in the previous fabrication embodiments, the bonding layer has a rectangular hole 305.

As manufacturing processes according to this embodiment of the present invention transform first intermediate assembly 300a (see FIG. 10A) to second intermediate assembly 300b (FIG. 10B): (i) first photoresist layer 306 is overlaid over cap 302 and bonding layer 304; and (ii) photoresist layer 306 is patterned to include masking open areas 315.

As manufacturing processes according to this embodiment of the present invention transform second intermediate assembly 300b (see FIG. 10B) to third intermediate assembly 300c (FIG. 10C): (i) RIE is used to remove portions of cap material underlying masking open areas 315 in order to form cylindrical recesses 316; and (ii) first photoresist layer 306 is stripped away.

As manufacturing processes according to this embodiment of the present invention transform third intermediate assembly 300c (see FIG. 10C) to fourth intermediate assembly 300d (FIG. 10D): (i) second photoresist layer 308 is laid over assembly 300c; and (ii) the second photoresist layer is patterned to make MNS masking region 313.

As manufacturing processes according to this embodiment of the present invention transform fourth intermediate assembly 300d (see FIG. 10D) to final assembly 300e (FIG. 10E): (i) RIE is used to form MNSs (for example, nanowires) in MNS region 314; and (ii) second photoresist layer 308 is stripped away. In this third example fabrication process, further processing is similar to what is shown and discussed, above, in connection with FIGS. 9F to 9H of the second example fabrication process.

Figure 11A:
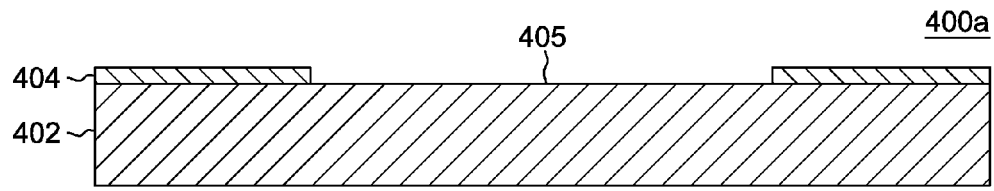
FIGS. 11A, 11B, 11C, 11D, 11E, 11F, and 11G are cross-sectional views of a semiconductor assembly corresponding respectively to four stages of a second semiconductor fabrication method.
Figure 11B:
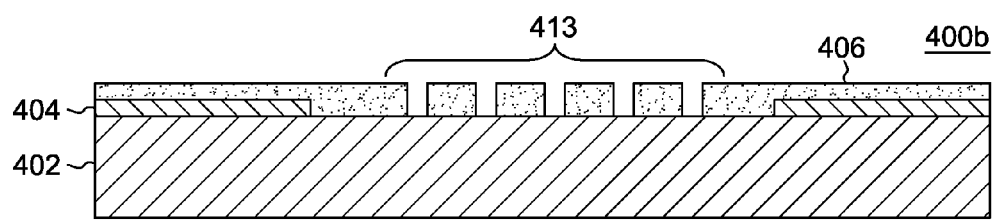
Figure 11C:
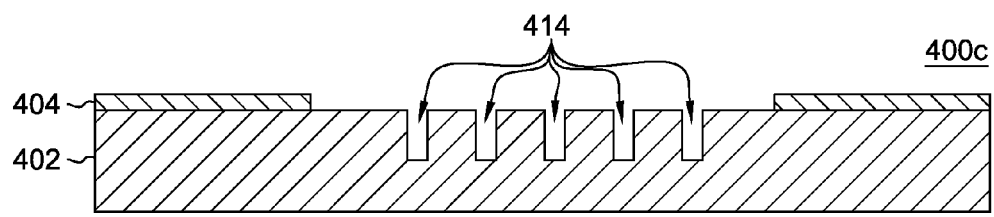
Figure 11D:
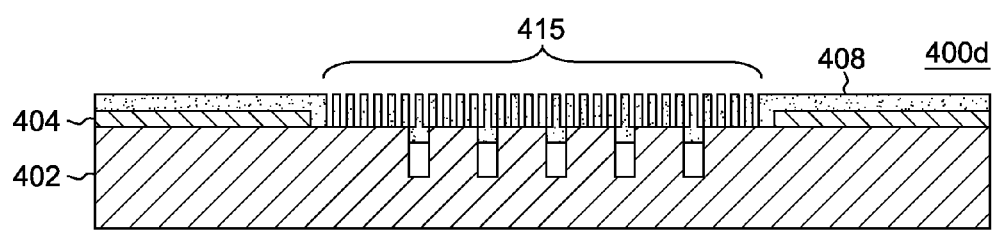
Figure 11E:
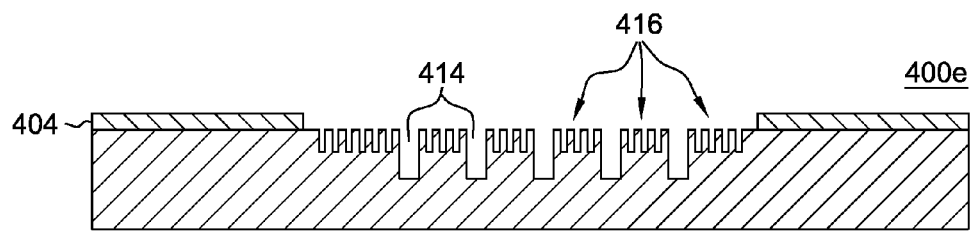
Figure 11F:
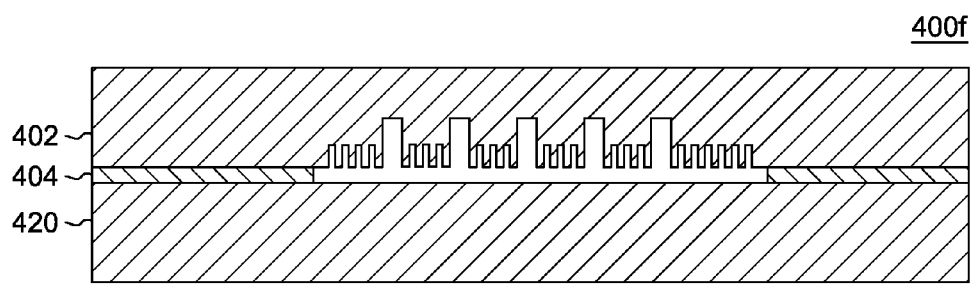
Figure 11G:
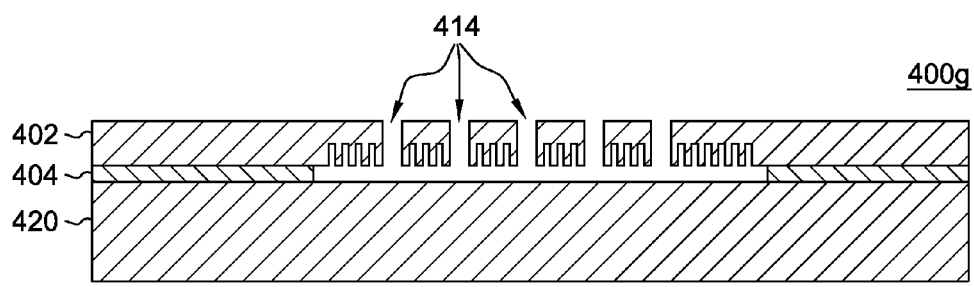

FIGS. 11A to 11G respectively show six (6) intermediate assemblies (assemblies 400a, 400b, 400c, 400d, 400e and 400f respectively FIGS. 11A to 11F) and one (1) sub-assembly (assembly 400g of FIG. 11G). These assemblies show a fourth example of a fabrication process according to the present disclosure called the "channel first, MNSs last method."). For pedagogical purposes, it is noted that the respective assemblies 400a to 400f do not represent an exhaustive list of assembly states during manufacture, but, rather, these assemblies were chosen to efficiently assist those of skill in the art to understand the devices and/or manufacturing processes of the present invention. The following paragraphs will describe the processes involved in transforming the starting assembly 400a to intermediate assembly 400b, intermediate assembly 400b to intermediate assembly 400c, intermediate assembly 400c to intermediate assembly 400d, and so on until the final assembly of 400f is attained for use as an embodiment of a GADLC IC device.

As shown in FIGS. 11A to 11G, assemblies 400a to 400g collectively include: silicon cap layer (or, simply, "cap") 402; bonding layer 404; rectangular hole 405; first photoresist layer 406; second photoresist layer 408; channel masking region 413; channels 414; MNS masking region 415; and MNS region 416.

As shown in FIG. 11A, first intermediate assembly 400a is provided with bonding layer 404 overlaid on cap 402. As in the previous fabrication embodiments, the bonding layer has a rectangular hole 405.

As manufacturing processes according to this embodiment of the present invention transform first intermediate assembly 400a (see FIG. 11A) to second intermediate assembly 400b (FIG. 11B): (i) first photoresist layer 406 is overlaid over cap 402 and bonding layer 404; and (ii) first photoresist layer 406 is patterned to include channel masking region 413.

As manufacturing processes according to this embodiment of the present invention transform second intermediate assembly 400b (see FIG. 11B) to third intermediate assembly 400c (FIG. 11C): (i) RIE is used to remove portions of cap material underlying unmasked portions of channel masking region 413 in order to form channels 414; and (ii) first photoresist layer 406 is stripped away. In this step, channel diameter is on the order of tens of microns to a few millimeters, and depth is on the order of tens to hundreds of microns. The opening of the channel structure can be performed by RIE.

As manufacturing processes according to this embodiment of the present invention transform third intermediate assembly 400c (see FIG. 11C) to fourth intermediate assembly 400d (FIG. 11D): (i) second photoresist layer 408 is laid over assembly 400c; and (ii) the second photoresist layer is patterned to make MNS masking region 415.

As manufacturing processes according to this embodiment of the present invention transform fourth intermediate assembly 400d (see FIG. 11D) to fifth intermediate assembly 400e (FIG. 11E): (i) RIE is used to form MNSs (for example, nanowires) in MNS region 416; and (ii) second photoresist layer 408 is stripped away.

As shown in FIGS. 11F to 11G, cap sub-assembly 402, 404 is flipped onto chip 420 (or larger chip bearing wafer (not shown)), bonded to it by the bonding layer and then subject to material removal from the cap so that channels 414 extend from the interior open space to the exterior surface of cap 402.

Figure 12A:
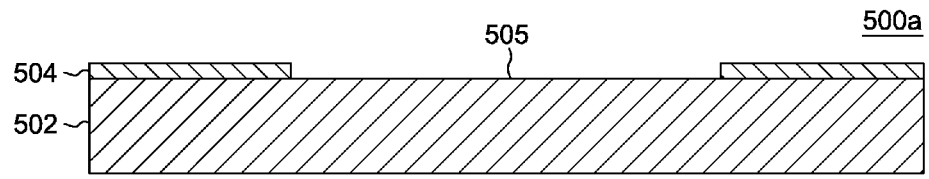
FIGS. 12A, 12B, 12C, 12D and 12E are cross-sectional views of a semiconductor assembly corresponding respectively to five stages of a second semiconductor fabrication method.
Figure 12B:
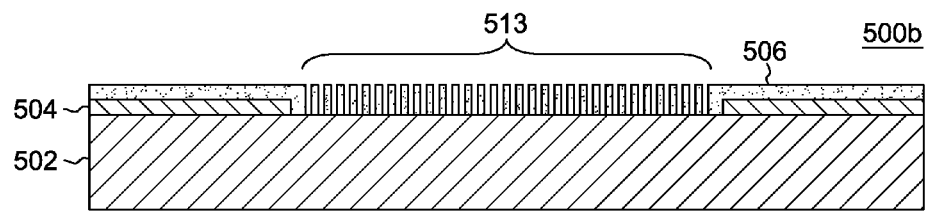
Figure 12C:
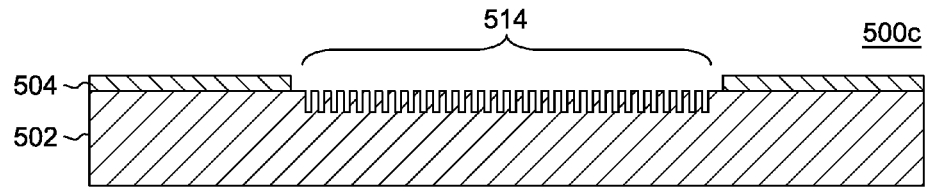
Figure 12D:
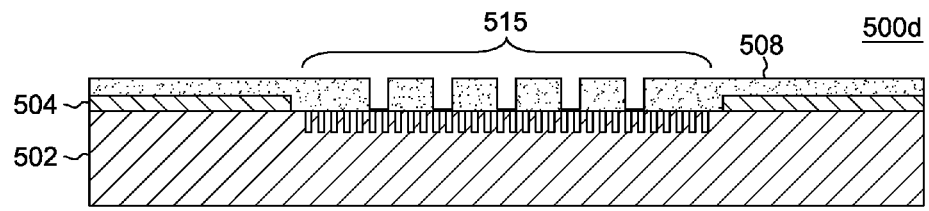
Figure 12E:
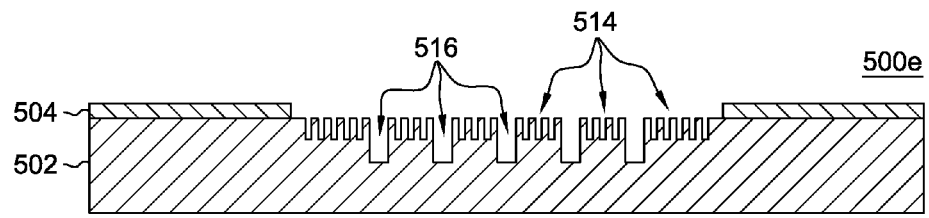

FIGS. 12A to 12E respectively show four (4) intermediate assemblies (assemblies 500a, 500b, 500c and 500d respectively of FIGS. 12A to 12D) and one (1) final sub-assembly (assembly 500e of FIG. 12E). These assemblies show a fifth example of a fabrication process according to the present disclosure called the "MNSs first method, channels last (without open areas) method."). For pedagogical purposes, it is noted that the respective assemblies 500a to 500d do not necessarily represent an exhaustive list of assembly states during manufacture, but, rather, these assemblies were chosen to efficiently assist those of skill in the art to understand the devices and/or manufacturing processes of the present invention. The following paragraphs will describe the processes involved in transforming the starting assembly 500a to intermediate assembly 500b, intermediate assembly 500b to intermediate assembly 500c, and so on until the final assembly of 500d is attained for use as an embodiment of a GADLC IC device.

As shown in FIGS. 12A to 12E, assemblies 400a to 400g collectively include: cap 502; bonding layer 504; rectangular hole 505; first photoresist layer 506; second photoresist layer 508; MNS masking region 513; MNS region 514; channel masking region 515; and channels 516.

As shown in FIG. 12A, first intermediate assembly 500a is provided with bonding layer 504 overlaid on cap 502. As in the previous fabrication embodiments, the bonding layer has a rectangular hole 505.

As manufacturing processes according to this embodiment of the present invention transform first intermediate assembly 500a (see FIG. 12A) to second intermediate assembly 500b (FIG. 12B): (i) first photoresist layer 506 is overlaid over cap 502 and bonding layer 504; and (ii) first photoresist layer 506 is patterned to include MNS masking region 513.

As manufacturing processes according to this embodiment of the present invention transform second intermediate assembly 500b (see FIG. 12B) to third intermediate assembly 500c (FIG. 12C): (i) RIE is used to remove portions of cap material underlying unmasked portions of MNS masking region 513 in order to form MNS region 514; and (ii) first photoresist layer 506 is stripped away.

As manufacturing processes according to this embodiment of the present invention transform third intermediate assembly 500c (see FIG. 12C) to fourth intermediate assembly 500d (FIG. 12D): (i) second photoresist layer 508 is laid over assembly 500c; and (ii) the second photoresist layer is patterned to make channel masking region 515.

As manufacturing processes according to this embodiment of the present invention transform fourth intermediate assembly 500d (see FIG. 12D) to fifth intermediate assembly 500e (FIG. 12E): (i) RIE is used to form channels 516; and (ii) second photoresist layer 508 is stripped away. Subsequent processing (not shown in the Figures) is similar to that discussed above in connection with FIGS. 11F and 11G of the fourth example fabrication process.

The following paragraphs set forth some definitions.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Micro-structure: a structure having formed therein pores, gaps and or interstitial spaces equal to or less than 100 micrometers but more than 100 nanometers; for example, a set of microwires arranged in a regular array and spaced at a center-to-center pitch of 100 micrometers would be an example (although not necessarily a preferred example) of a "micro-structure."

Nano-structure: a structure having formed therein pores, gaps and or interstitial spaces equal to or less than 100 nanometers; for example, a set of nanowires arranged in a regular array and spaced at a center-to-center pitch of 100 nanometers would be an example (although not necessarily a preferred example) of a "nano-structure."

Small-scale-structure: a micro-structure or nano-structure.

Rigid: at least substantially as rigid as the least rigid of the following: silicon, SixAly, SiC, SixNy, quartz, AN, or $Al_2O_3$; more rigid than a polymer membrane.

Surface: not limited to planar, continuous and/or smooth surfaces.

What is claimed is:

1. A semiconductor assembly including:
  a substrate member including a first chip and a top surface; and
  a cap member with a first recess formed therein, the cap member including a first recess surface and a first set of rigid small scale structure(s) extending from at least a portion of the first recess surface into the first recess, with the first recess surface and the first set of rigid small scale structure(s) defining the first recess;

wherein:

the first set of rigid small scale structure(s) include a structure having formed therein pores, gaps and or interstitial spaces sized and shaped to facilitate gas-assisted direct liquid cooling fluid flow through the first recess;

the first set of rigid small scale structure(s) are sized, shaped and located to provide for appropriate fluid flow when gas and liquid are circulated through the first recess for gas-assisted direct liquid cooling;

the cap member is attached to the top surface of the substrate member at a location such that circulation of gas and liquid through the first recess cools the first chip by gas-assisted direct liquid cooling;

the member cap has a plurality of channels formed therethrough, with the channels being shaped and sized to allow for gas-assisted direct liquid cooling fluid flow through the first recess.

2. The assembly of claim 1 wherein:

the cap member includes an exterior surface that is generally opposite the first recess surface; and the plurality of channels extend through the cap member from the first recess surface to the exterior surface of the cap member.

3. The assembly of claim 2 further comprising:

cooling liquid located in the first recess.

4. The assembly of claim 1 wherein:

the first set of rigid small-scale-structure(s) is shaped to define interior spaces that help control circulation of gas and liquid through the first recess to thereby help cool the first chip by gas-assisted direct liquid cooling.

5. The assembly of claim 4 wherein:

the first set of rigid small-scale-structure(s) includes a structure having formed therein pores, gaps and/or interstitial spaces less than 100 micrometers in size.

6. The assembly of claim 1 wherein:

the substrate member is at least partially made of silicon.

7. The assembly of claim 6 wherein:

the first set of rigid small-scale-structure(s) is made by etching the cap member in a top down material removal fashion, except in portions underlying remaining portions of a patterned photoresist layer.

8. The assembly of claim 1 further comprising a bonding layer structured, sized, shaped and/or located to bond the cap member and the substrate member to each other so that cooling fluid does not leak from between the cap member and the substrate member.

9. A semiconductor assembly including:

a substrate member including a plurality of chips and a top surface; and a cap member with a plurality of recesses formed therein, the cap member including a recess surface corresponding to each recess of the plurality of recesses and a plurality of sets of rigid small scale structure(s) respectively extending from at least a portion of each recess surface into each recess, with each recess surface and each set of rigid small scale structure(s) respectively defining a corresponding recess of the plurality of recesses;

wherein:

each set of rigid small scale structure(s) includes a structure having formed therein pores, gaps and or interstitial spaces equal to or less than 100 micrometers and is made by etching the cap member in a top down material removal fashion, except in portions underlying remaining portions of a patterned photoresist layer;

each set of rigid small scale structure(s) are sized, shaped and located to provide for appropriate fluid flow when gas and liquid are circulated through the first recess for gas-assisted direct liquid cooling; and the cap member is attached to the top surface of the substrate member at a location such that circulation of gas and liquid through each recess cools a corresponding chip of the plurality of chips by gas-assisted direct liquid cooling.

10. The assembly of claim 9 wherein:

the cap member includes an exterior surface that is generally opposite the recess surfaces; and the cap member has formed therein a plurality of pluralities of channels, with each plurality of channels extending through the cap member from a respectively corresponding recess surface to the exterior surface of the cap member.

11. The assembly of claim 10 wherein:

each channel of each plurality of channels has a sufficiently large transverse cross-section allowing communication of fluid in gas-assisted direct liquid cooling of the first chip.

12. The assembly of claim 9 wherein:

the first set of rigid small-scale-structure(s) is shaped to define interior spaces sufficiently small such that circulation of gas and liquid through the first recess cools the first chip by gas-assisted direct liquid cooling.

13. The assembly of claim 9 wherein:

each set of rigid small-scale-structure(s) includes a structure having formed therein pores, gaps and/or interstitial spaces less than 100 nanometers in size.

14. The assembly of claim 9 wherein:

the substrate member is made of silicon.

15. The assembly of claim 14 wherein:

the cap member is made of silicon; and each set of rigid small-scale-structure(s) is made of silicon.

* * * * *